United States Patent [19]

Rodgers

[11] 3,933,985
[45] Jan. 20, 1976

[54] PROCESS FOR PRODUCTION OF POLYCRYSTALLINE SILICON

[75] Inventor: Michael A. Rodgers, Tempe, Ariz.

[73] Assignee: Motorola, Inc., Chicago, Ill.

[22] Filed: Sept. 24, 1971

[21] Appl. No.: 183,584

[52] U.S. Cl. .................................. 423/350; 423/342
[51] Int. Cl.$^2$ .................. C01B 33/00; C01B 33/02; C01B 33/08
[58] Field of Search ........................... 423/342, 350

[56] References Cited

UNITED STATES PATENTS

| | | | |
|---|---|---|---|
| 2,595,620 | 5/1952 | Wagner et al. | 423/342 |
| 2,768,061 | 10/1956 | Cook et al. | 423/276 |
| 2,904,404 | 9/1959 | Ellis, Jr. | 423/350 |
| 2,943,918 | 7/1960 | Pauls | 423/350 |
| 3,325,314 | 6/1967 | Allegretti | 423/350 X |
| 3,488,152 | 1/1970 | Kuehl | 423/298 |
| 3,565,590 | 2/1971 | Bracken | 423/342 |

FOREIGN PATENTS OR APPLICATIONS

| | | | |
|---|---|---|---|
| 904,009 | 8/1962 | United Kingdom | 423/342 |

OTHER PUBLICATIONS

J. W. Mellor's "A Comprehensive Treatise on Inorganic and Theoretical Chem.," Vol. 6, 1925, p. 964. Longmans, Green & Co., N.Y.

Handbook of Chemistry and Physics, 43rd Ed., 1961, p. 2321. The Chemical Rubber Publishing Co., Cleveland, Ohio.

Hurd, "Journal Of The American Chemical Society," Vol. 67, pp. 1545–1548 (1945).

*Primary Examiner*—Edward Stern
*Attorney, Agent, or Firm*—Harry M. Weiss; Henry T. Olsen

[57] ABSTRACT

There is disclosed a process for the hydrogen reduction of silicon tetrachloride to produce trichlorosilane. In accordance with the process, hydrogen and silicon tetrachloride vapors are passed through a reaction chamber at relatively high flow rates with approximately 50 mole percent silicon tetrachloride in the mixture. The reaction vessel is held at a temperature of between 900° and 1200° C. This process is a part of an overall system for the production of polycrystalline silicon for the semiconductor industry.

4 Claims, 3 Drawing Figures

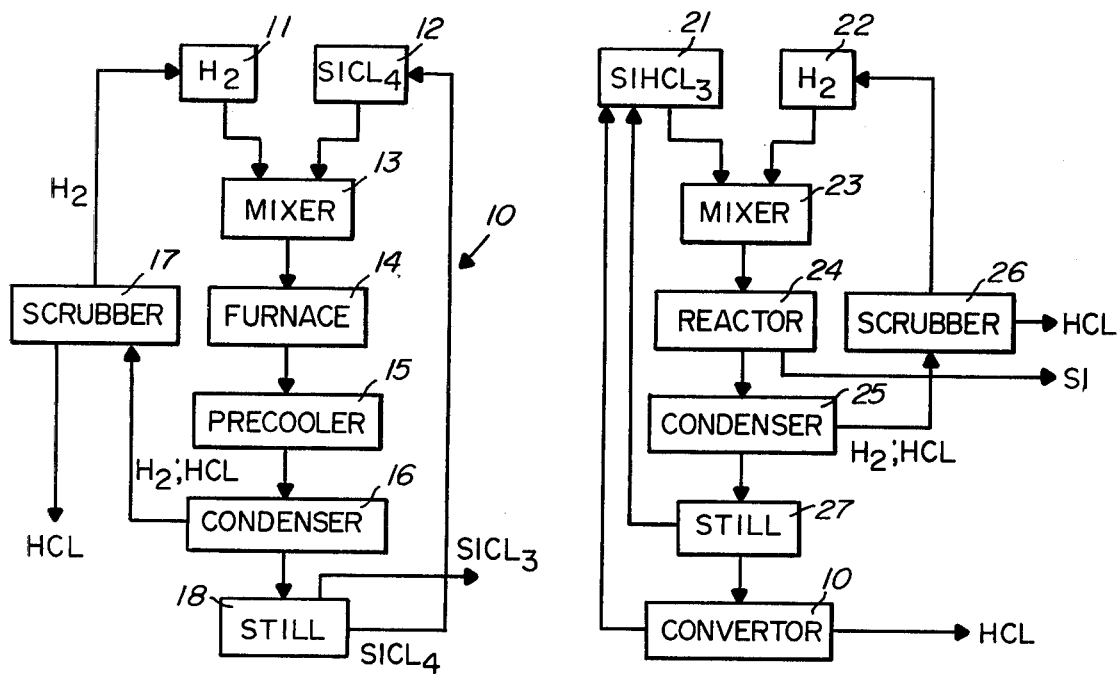
Fig.1
Fig.2
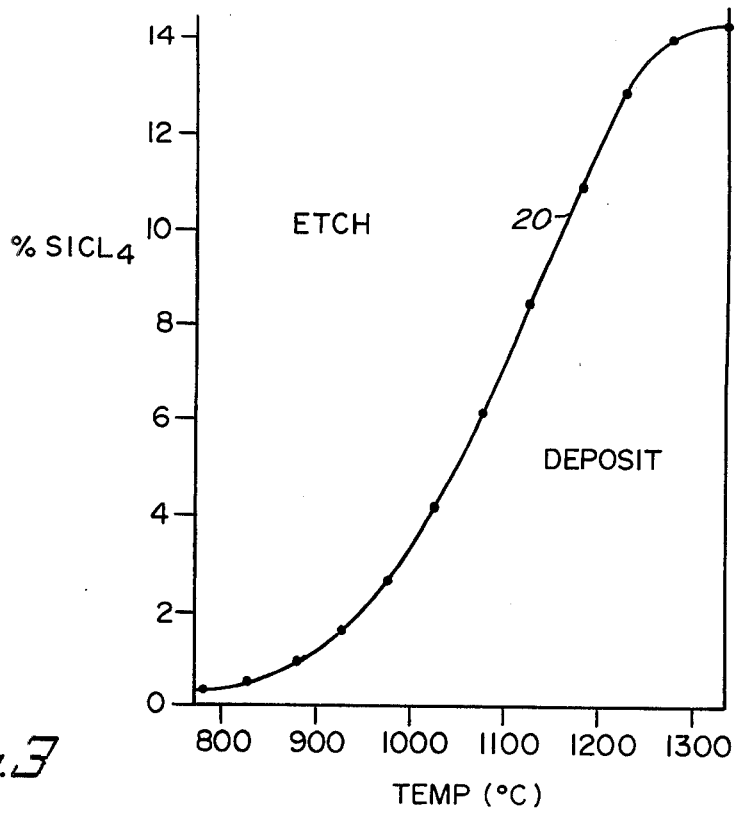
Fig.3

PROCESS FOR PRODUCTION OF POLYCRYSTALLINE SILICON

BACKGROUND OF THE INVENTION

This invention relates to a process for producing semiconductor grade silicon and more particularly to the production of trichlorosilane as a part of that process.

In the semiconductor industry relatively large quantities of high purity monocrystalline silicon are required for the production of semiconductor devices and integrated circuits.

One of the most commonly used methods for the growth of monocrystalline silicon is the Czochralski method in which a charge of hyperpure polysilicon is placed in a high purity quartz crucible set inside a graphite susceptor. The susceptor, crucible, and charge are placed in a controlled inert atmosphere inside a quartz cylinder. RF induction coils are placed outside the quartz cylinder and around the graphite susceptor. RF power is supplied to the coils and the charge is heated until it is completely molten and the temperature has been stabilized just above the melting point of the cylinder. After stabilization of the temperature, a seed crystal is dipped into the melt and the seed is allowed to melt back a short distance to remove any surface imperfections which may have resulted from its preparation. The seed is then rotated and very slowly withdrawn from the melt. With the temperature of the melt properly maintained, the seed grows into a single oriented crystal.

The hyperpure polysilicon can be produced by hydrogen reduction of trichlorosilane at a temperature of about 1100°C. During the process, a large proportion of the trichlorosilane is not reduced to silicon but is converted to silicon tetrachloride in accordance with the approximate reaction: $3SiHCl_3 + H_2 \rightarrow Si + SiHCl_3 + SiCl_4 + 2HCl + H_2$. Thus, only ⅓ of the trichlorosilane converts to silicon while ⅓ remains unreacted and another ⅓ converts to silicon tetrachloride. The residual gases can be separated to remove the trichlorosilane from the residue and returned as part of the feed for the reaction. However, the silicon tetrachloride has been essentially a waste product except to the extent that it is used in the epitaxial deposition of silicon upon silicon slices, as set forth in the article, "Analysis of the Hydrogen Reduction of Silicon Tetrachloride Process on the Basis of a Quasi-Equilibrium Model", T. O. Sedgewick, *Journal of the Electrochemical Society*, December, 1964, pages 1381–1383.

The Si—Cl—H system is a complex multireaction system, essentially reversible, in which partial pressures of several species occur. These species are for example, $H_2$, $HCl$, $SiCl_4$, $SiHCl_3$, $SiCl_2$, $SiH_2Cl_2$, $SiH_3Cl$, $SiCl$, $SiH_4$ and Si in some equilibrium which is a function of pressure, silicon/chlorine/hydrogen ratio, and temperature. Thus, for example, the reaction $SiCl_4 + 2H_2 \rightleftharpoons Si + 4HCl$ is reversible to either deposit an epitaxial layer of silicon on a silicon slice or to etch a silicon slice by removing silicon therefrom. The reversibility of this reaction is normally used in a epitaxial reactor, wherein the silicon slice may be etched by a higher concentration of HCl in the vapors to produce a clean surface on the silicon wafer and then the concentration of $SiCl_4$ is increased to affect deposition of monocrystalline silicon on the cleaned slice.

The products of the reaction are also controlled by the presence of certain catalysts such as copper, nickel or silicon. Thus, for example, in U.S. Pat. No. 2,595,620, Wagner et al, silicon tetrachloride is partially converted to trichlorosilane in the presence of a catalytic metal. Similarly, chlorosilanes are prepared in U.S. Pat. No. 2,657,114, Wagner, by reacting a metal chloride with silicon, wherein the metal of the chloride is a catalytic metal. Another process for obtaining trichlorosilane from silicon in the presence of a catalyst is disclosed in U.S. Pat. No. 2,943,918, Pauls. In the production of silicon for semiconductor purposes, the presence of such catalytic metals is undesirable since the metals can be dopants affecting the electrical characteristics of the semiconductor. Thus, for semiconductor purposes, a reaction in which no catalytic metal appears is highly desirable.

SUMMARY OF THE INVENTION

It is a primary object of this invention to provide a process for converting silicon tetrachloride to trichlorosilane.

It is a further object of this invention to convert silicon tetrachloride to trichlorosilane without the use of a contaminating catalyst.

A further object of the invention is to convert residual silicon tetrachloride from the process of making semiconductor grade silicon to trichlorosilane which can be recycled for production of semiconductor grade silicon.

In accordance with these objects there is provided a process of producing trichlorosilane which comprises mixing a vapor of silicon tetrachloride with hydrogen, reacting said mixture at a temperature between 900° and 1200° C., and separating the trichlorosilane therefrom.

THE DRAWINGS

Further objects and advantages of the invention will be apparent from the following complete description thereof and from the drawings wherein:

FIG. 1 is a flow diagram of a process in accordance with the invention for converting silicon tetrachloride to trichlorosilane;

FIG. 2 is a flow diagram of a process for producing polycrystalline silicon from trichlorosilane including a process for converting residual silicon tetrachloride to trichlorosilane and FIG. 3 is a graph of the reaction of silicon tetrachloride and hydrogen as a function of concentration and temperature.

A preferred converter process 10 in accordance with the invention is depicted in the flow diagram of FIG. 1 and includes a source 11 of hydrogen and a source 12 of silicon tetrachloride which are fed in suitable proportions to a mixer 13 to provide a gaseous mixture of the hydrogen and the silicon tetrachloride. This mixture is passed through a furnace reactor unit 14 at suitable rates and temperatures to convert a portion of the silicon tetrachloride to trichlorosilane. The reaction products from the furnace 14 are passed through pre-cooler 15 to lower the temperature of the products to approximately room temperature. The room temperature gases are then passed through a condenser unit 16 to separate the hydrogen and hydrochloric acid reaction products from the silicon tetrachloride and chlorosilane liquid products. The hydrogen gas and the hydrochloric acid gaseous products are directed through a water scrubber 17 which separates the hydrochloric acid from the hydrogen and the hydrogen gas after suitable drying can be reused by the hydrogen source 11. The liquid mixture of silicon tetrachloride and trichlorosilane is passed through a distilling unit 18 which separates the trichlorosilane product from the silicon tetrachloride which later can be redirected to the source 12 for recycling through the process.

Silicon tetrachloride can react with hydrogen as follows:
(1) $SiCl_4 + 2H_2 \rightarrow Si + 4HCl$
(2) $SiCl_4 + H_2 \rightarrow SiHCl_3 + HCl$ These reactions are dependent upon the temperature and percent of silicon tetrachloride in the gaseous mixture as indicated in the graph of FIG. 3, wherein the area under the curve 20 indicates that a deposition of silicon in accordance with reaction (1) above is favored, while above the curve 20, formation of trichlorosilane is favored and no silicon will be deposited. It should be noted that in either case, the reactions (1) or (2) above are fairly incomplete, in that silicon tetrachloride is still the dominant gas resultant from the process. Thus, while the desired product is ultimately silicon by conversion from trichlorosilane, the production of silicon directly from silicon tetrachloride is too slow for economic production of polycrystalline silicon. Care must be taken in operation of the process in accordance with the invention to prevent deposition of silicon within the reaction furnace 14 since the silicon acts as a catalyst or nucleating agent in favor of reaction (1) rather than in favor of the formation of trichlorosilane (reaction 2), as is desired. To avoid formation of any silicon in the reaction furnace, it is therefore desirable that a minimum of 5% silicon tetrachloride be maintained in the feed to the reaction chamber, and as shall be shown, a preferred feed contains approximately 50% silicon tetrachloride. The feed mixture may comprise 25–55% silcon tetrachloride vapor. Also, as indicated in the graph of FIG. 3, some deposition of silicon takes place as temperatures above 1150°C are utilized. Also at these higher temperatures, some conversion of the silicon tetrachloride to the higher chlorides such as a silicon subchloride takes place. These higher chlorides are of a viscous, oily nature which are difficult to remove from the system. Since the percent of trichlorosilane in the output generally increases with increasing temperature, it is preferable that the process be operated near the upper limit of this range, i.e., about 1100°C to maximize output while still avoiding contaminating products.

The following are exemplary of the process.

EXAMPLE I

In accordance with the invention, hydrogen and silicon tetrachloride were mixed in the proportion of 60 mole percent hydrogen and 40 mole percent silicon tetrachloride. This mixture was fed through the reaction furnace at a temperature of 1000°C at a feed rate such that the individual components have a 6.5 seconds dwell time within the furnace. The resultant product contained 12.5 percent trichlorosilane.

EXAMPLE II

Under similar conditions as above, except with the reaction furnace at a 900°C temperature and using a feed rate such that the gas has a 2.5 second dwell time, the resultant product contained 9.8 percent trichlorosilane.

EXAMPLE III

With a similar mixture as above and the furnace at an 800°C temperature and the feed rate such that 2.3 seconds was the dwell time, the product contained 2.1 percent trichlorosilane.

The output with varying amounts of silicon tetrachloride percentage in the feed, was determined by several runs made at a temperature of 1100°C with a constant volumetric flow rate. The following results were obtained:

| EXAMPLE | %SiCl$_4$ IN FEED | %SiCl$_3$ IN OUTPUT |
| --- | --- | --- |
| IV | 17.7 | 3.95 |
| V | 17.7 | 3.57 |
| VI | 17.7 | 3.60 |
| VII | 28.2 | 3.58 |
| VIII | 28.2 | 4.24 |
| IX | 28.2 | 3.91 |
| X | 38.5 | 4.04 |
| XI | 38.5 | 4.31 |
| XII | 38.5 | 4.25 |
| XIII | 50.0 | 3.99 |
| XIV | 50.0 | 4.44 |
| XV | 50.0 | 4.38 |
| XVI | 59.2 | 3.71 |
| XVII | 59.2 | 4.17 |
| XVIII | 59.2 | 4.11 |
| XIX | 69.6 | 3.61 |
| XX | 69.6 | 3.78 |
| XXI | 69.6 | 3.63 |

From the above, it will be seen that maximum output of trichlorosilane occurs at a feed concentration of 50% silicon tetrachloride and 50% hydrogen, with the output dropping off at all higher and lower concentrations.

The output of trichlorosilane with varying feed rates was determined. The flow rates in the following example are given in terms of a Reynolds number ($R_e$). The Reynolds number equals the diameter of the particles times the velocity times the density, divided by the viscosity and therefore the Reynolds number is directly proportional to flow rate. Examples were run at 1100°C with 50% silicon tetrachloride in the feed.

| EXAMPLE | FLOW RATE ($R_e$) | %SiCl$_3$ IN OUTPUT |
| --- | --- | --- |
| XXII | 54 | 4.45 |
| XXIII | 116 | 4.47 |
| XXIV | 173 | 4.83 |

The converter process 10 depicted in FIG. 1 is readily adaptable to an overall polycrystalline silicon reactor process as depicted in FIG. 2. In the production of polycrystalline silicon a source 21 of trichlorosilane and a source 22 of hydrogen are provided to feed a mixer 23 which mixes the trichlorosilane and hydrogen in suitable volumetric proportions. The mixture of trichlorosilane and hydrogen is fed to a reactor furnace 24 which reduces a certain percentage of the trichlorosilane to silicon with residues including hydrogen, hydrochloric acid and silicon tetrachloride. The hydrogen and hydrochloric acid are separated from the residues in a condenser unit 25 which byproducts are directed to a water scrubber 26 which removes the hydrochloric acid from the system while redirecting the cleaned hydrogen back to the source 22. The unreacted trichlorosilane and silicon tetrachloride separated in the condenser unit 25 are directed to a distilling unit 26 which separates the trichlorosilane for return to the feed unit 21 and directs the silicon tetrachloride to the converter unit 10. The recovered trichlorosilane therefrom is directed to the feed source 21 and hydrochloric acid produced as a waste product. Since the scrubber, condenser and distilling units are common to both the system for producing polycrystalline silicon and to the converter process 10, it will be readily seen that these units can actually be shared in a common continuous cycle process, and the converter unit 10 need generally be merely the reaction furnace for reacting the silicon tetrachloride and hydrogen in accordance with the invention.

It is thus seen from the foregoing that there is provided a process which can be operated in conjunction with the production of polycrystalline silica to readily reconvert the silicon tetrachloride residue of the polycrystalline silicon production back into trichlorosilane for reconversion in the polycrystalline silicon process. This process is relatively inexpensive compared to the value of the product and also greatly reduces the amount of waste silicon tetrachloride produced by the major process.

Further objects and advantages of the invention will be understood to one skilled in the art and suitable modifications may be made therein without departing from the spirit and scope of the invention.

What is claimed is:

1. In a process producing polycrystalline silicon by the hydrogen reduction of trichlorosilane with hydrogen to produce silicon, unreacted trichlorosilane, and silicon tetrachloride and separating the trichlorosilane from the silicon tetrachloride, the improvement which comprises mixing the separated silicon tetrachloride with hydrogen to form a mixture consisting essentially of silicon tetrachloride and hydrogen; reacting said mixture in the absence of any other reactive material or catalyst at a temperature between 900° and 1100°C, at a dwell time of the order of several seconds and directly thereafter separating the trichlorosilane from the resultant product therefrom for use in the production of polycrystalline silicon.

2. A process of producing trichlorosilane as recited in claim 1 wherein said mixture comprises 25–55% silicon tetrachloride vapor.

3. A process of producing trichlorosilane as recited in claim 2 wherein the mixture comprises approximately 50% silicon tetrachloride vapor.

4. A process of producing trichlorosilane as recited in claim 1 wherein said temperature is approximately 1100°C.

* * * * *